US006829360B1

(12) United States Patent
Iwata et al.

(10) Patent No.: US 6,829,360 B1
(45) Date of Patent: Dec. 7, 2004

(54) METHOD AND APPARATUS FOR EXPANDING BAND OF AUDIO SIGNAL

(75) Inventors: Kazuya Iwata, Osaka (JP); Naoki Ejima, Osaka (JP); Akira Sobajima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/743,615

(22) PCT Filed: May 10, 2000

(86) PCT No.: PCT/JP00/02965

§ 371 (c)(1), (2), (4) Date: Jan. 12, 2001

(87) PCT Pub. No.: WO00/70769

PCT Pub. Date: Nov. 23, 2000

(30) Foreign Application Priority Data

May 14, 1999 (JP) .......................................... 11-133816

(51) Int. Cl.[7] ................................................ H03G 3/00
(52) U.S. Cl. ........................................... 381/61; 381/98
(58) Field of Search ........................... 381/61, 98, 94.1, 381/94.2, 94.3, 101, 102, 103, 56, 58, 59; 84/622, 659

(56) References Cited

U.S. PATENT DOCUMENTS

| | | | | |
|---|---|---|---|---|
| 4,700,390 A | * 10/1987 | Machida | ..................... | 704/500 |
| 5,298,676 A | * 3/1994 | Sasaki et al. | ................. | 84/624 |
| 5,455,888 A | 10/1995 | Iyengar et al. | | |
| 5,754,666 A | 5/1998 | Nakagawa | ................... | 381/98 |

FOREIGN PATENT DOCUMENTS

| | | |
|---|---|---|
| EP | 0732687 A2 | 9/1996 |
| JP | 3018964 | 9/1995 |
| JP | 3018964 | 12/1995 |
| JP | 9-23127 | 1/1997 |
| JP | 09-023127 | 1/1997 |
| JP | 9-55634 | 2/1997 |
| JP | 09-036685 | 2/1997 |
| JP | 09-055634 | 2/1997 |

OTHER PUBLICATIONS

Steven W. Smith, "The Scientist and Engineer's Guide to Digital Signal Processing", California, U.S., 1997, p. 60.*

Yan Ming Cheng et al., "Statistical Recovery of Wideband Speech from Narrowband Speech", IEEE Transactions on Speech and Audio Processing, IEEE Inc., New York, U.S., vol. 2, No. 4, Oct. 1994, pp. 544–548, XP002106825, ISSN: 1063–6676.

* cited by examiner

*Primary Examiner*—Forester W. Isen
*Assistant Examiner*—Corey Chau
(74) *Attorney, Agent, or Firm*—Wenderoth, Lind & Ponack, L.L.P.

(57) ABSTRACT

A low-pass filter of over-sampling type oversamples an input digital audio signal T1 and filters and removes the low frequency components of the produced aliasing noise. A spectrum analyzer circuit calculates the spectrum intensity of a predetermined band of an output signal from the low-pass filter. An expanded signal generating circuit generates an expanded signal having frequency components of the output signal from the low-pass filter. A level control circuit controls the level of the expanded signal according to the spectrum analyzer circuit. An adder adds the level-controlled expanded signal to the output signal from the low-pass filter thereby to generate a digital audio signal T2.

18 Claims, 13 Drawing Sheets

FIRST PREFERRED EMBODIMENT
AUDIO SIGNAL BAND EXPANDING APPARATUS

SPECTRUM ANALYZER CIRCUIT 3

DITHER SIGNAL GENERATING CIRCUIT 23

PN-SEQUENCE NOISE SIGNAL GENERATING CIRCUIT 60—n

SECOND PREFERRED EMBODIMENT
AUDIO SIGNAL BAND EXPANDING APPARATUS

SPECTRUM ANALYZER CIRCUIT 6

METHOD AND APPARATUS FOR EXPANDING BAND OF AUDIO SIGNAL

TECHNICAL FIELD

The present invention relates to a method and an apparatus for expanding a band of an audio signal, capable of reproducing an audio signal pleasant to the human ear by improving the quality of a reproduced sound of an audio signal reproduced by audio equipment, and in particular, the quality of a reproduced sound of high audio frequencies. More particularly, the present invention relates to a method and an apparatus for expanding a band of an input audio signal by performing digital processing for the input audio signal.

BACKGROUND ART

The Japanese patent laid-open publication No. 9-36685 discloses an audio signal reproducing apparatus of the prior art for combining an analog audio reproduced signal with a signal having a frequency spectrum exceeding the highest audio frequency of a reproduction frequency band or the highest limit of the high audio frequency of an audible frequency band. A configuration of the audio signal reproducing apparatus is shown in FIG. 17. Referring to FIG. 17, the audio signal reproducing apparatus is constituted by comprising a buffer amplifier 91, a filter circuit 92, an amplifier 93, a detector circuit 94, a time constant circuit 95, a noise generator 96, a filter circuit 97, a multiplier 98 and an adder 99.

First of all, an audio signal is inputted to the buffer amplifier 91 from an input terminal T1, and then, is divided into two audio signals. One divided audio signal is inputted directly to the adder 99, whereas another divided audio signal is inputted to the filter circuit 92 which is of a high-pass filter or a band-pass filter. The filter circuit 92 band-pass-filters only a specific-band signal of the input audio signal, allows the signal to pass through the filter circuit 92, and then, outputs the same signal to the amplifier 93. The amplifier 93 amplifies the input audio signal to a predetermined appropriate level, and then, outputs the amplified signal to the detector circuit 94 having the time constant circuit 95. The detector circuit 94 detects an envelope level of the audio circuit by, for example, envelope detection of the input audio signal. Then, the detector circuit 94 outputs a level signal indicative of the detected envelope level to the multiplier 98 as a level control signal for controlling a level of a noise component to be added to the original audio signal.

On the other hand, a noise component generated by the noise generator 96 is inputted to the filter circuit 97 which is of a high-pass filter or a band-pass filter. The filter circuit 97 allows passage of a noise component of a frequency band of 20 kHz or more, and then, outputs the noise component to the multiplier 98. The multiplier 98 multiplies the input noise component by the level control signal from the detector circuit 94, generates a noise component having a level proportional to the level indicated by the level control signal, and then, outputs the generated noise component to the adder 99.

Furthermore, the adder 99 adds the noise component from the multiplier 98 to the original audio signal from the buffer amplifier 91, generates the audio signal having the added noise component, and then, outputs the audio signal through an output terminal T2. In this case, a time constant of the time constant circuit 95 is selected so as to have a predetermined value, and this leads to adapting the noise component generated by the noise generator 96 to characteristics of the human sense of hearing and thus enhancing an effect of improving sound quality of the audio signal.

As described above, a high-frequency range is expanded by adding random noise proportional to an output level of high audio frequencies of the original audio signal to the original audio signal. However, the above-mentioned audio signal reproducing apparatus of the prior art has the following problems.

(1) The sound is unpleasant to the ear on the quality of sound since a spectral structure of a high-frequency signal of an additional noise component is different from that of a musical sound signal.

(2) Since the audio signal reproducing apparatus of the prior art comprises an analog circuit, the apparatus has the following problems. That is, the performance of the apparatus changes due to variations in parts of the analog circuit and temperature properties. Consequently, deterioration in sound quality occurs each time when an audio signal passes through the analog circuit. Moreover, improvement in precision of the filter circuit constituting the analog circuit causes an increase in the scale of the filter circuit and thus an increase in the manufacturing cost.

(3) Further, when a signal having a single spectrum such as a sinusoidal wave is inputted to the apparatus, a random noise component is added to the signal. Therefore, the measurement of signal characteristics results in marked deterioration in the signal characteristics.

DISCLOSURE OF THE INVENTION

It is an essential object of the present invention to solve the above-mentioned problems, and provide a method and an apparatus for expanding a band of an audio signal, which eliminate the unpleasantness of a sound, cause no deterioration in sound quality, cause little variation in performance of the apparatus, and reduce manufacturing cost as compared to the prior art.

It is another object of the present invention to solve the above-mentioned problems, and provide a method and an apparatus for expanding a band of an audio signal, in which the measurement of signal characteristics does not result in deterioration in a signal even if a sinusoidal signal is inputted to the apparatus.

According to the present invention, there is provided a method for expanding a band of an audio signal including the steps of:

oversampling a digital audio signal of a first band having a predetermined maximum frequency with a sampling frequency that is two or more times the maximum frequency, and low-pass-filtering an oversampled digital audio signal so as to eliminate aliasing noise caused by the oversampling, and outputting a low-pass-filtered digital audio signal;

calculating a spectrum intensity of a predetermined band of the low-pass-filtered digital audio signal, and outputting a signal indicating the calculated spectrum intensity;

generating an expanded signal having frequency components of a second band higher than the first band;

controlling a level of the expanded signal in response to the signal indicating the calculated spectrum intensity; and adding the expanded signal having the controlled level to the low-pass-filtered digital audio signal, and outputting a digital audio signal of addition result.

In the above-mentioned method, the step of generating the expanded signal preferably includes the steps of:

distorting the digital audio signal by performing non-linear processing on the low-pass-filtered digital audio signal with a non-linear input and output characteristic, and generating a digital signal having higher harmonic components of the digital audio signal; and high-pass-filtering at least frequency components equal to or higher than the second band, from the digital signal having the higher harmonic components, and outputting a high-pass-filtered signal as an expanded signal.

In the above-mentioned method, the step of generating the expanded signal preferably includes the steps of:

generating a dither signal having a predetermined probability distribution for an amplitude level; and high-pass-filtering at least frequency components equal to or higher than the second band, from the dither signal, and outputting a high-pass-filtered signal as an expanded signal.

In the above-mentioned method, the step of generating the expanded signal preferably includes the steps of:

distorting the digital audio signal by performing non-linear processing on the low-pass-filtered digital audio signal with a non-linear input and output characteristic, and generating a digital signal having higher harmonic components of the digital audio signal;

high-pass-filtering at least frequency components equal to or higher than the second band, from the digital signal having the higher harmonic components, and outputting a high-pass-filtered signal;

generating a dither signal having a predetermined probability distribution for an amplitude level;

high-pass-filtering at least frequency components equal to or higher than the second band from the dither signal, and outputting a high-pass-filtered signal; and adding the two high-pass-filtered signals, and outputting a signal of addition result as an expanded signal.

The above-mentioned method preferably further includes the step of low-pass-filtering the expanded signal with a filter characteristic that is either one of a predetermined 1/f characteristic and a predetermined $1/f^2$ characteristic, prior to the step of controlling the level.

In the above-mentioned method, the step of generating the dither signal preferably includes:

a plurality of steps of generating a plurality of pseudo noise sequence noise signals independent of each other, respectively; and a step of adding the plurality of pseudo noise sequence noise signals, generating a dither signal of addition result having a probability density of either one of a Gaussian distribution and a bell-shaped distribution for an amplitude level, and outputting the dither signal as an expanded signal.

The above-mentioned method preferably further includes the steps of:

calculating spectrum intensities of a plurality of predetermined bands of the low-pass-filtered digital audio signal, and judging whether or not the digital audio signal has a single spectrum in accordance with the calculated spectrum intensities of the plurality of bands; and switching over so as to output the expanded signal when judging that the digital audio signal does not have any single spectrum, and switching over so as not to output the expanded signal when judging that the digital audio signal has a single spectrum.

According to the present invention, there is provided an apparatus for expanding a band of an audio signal comprising:

filtering means for oversampling a digital audio signal of a first band having a predetermined maximum frequency with a sampling frequency that is two or more times the maximum frequency, and low-pass-filtering the oversampled digital audio signal so as to eliminate aliasing noise caused by the oversampling, and outputting a low-pass-filtered digital audio signal;

first spectrum analyzing means for calculating a spectrum intensity of a predetermined band of the low-pass-filtered digital audio signal outputted from the filtering means, and outputting a signal indicating the calculated spectrum intensity;

expanded signal generating means for generating an expanded signal having frequency components of a second band higher than the first band;

level controlling means for controlling a level of the expanded signal in response to the signal indicating the calculated spectrum intensity outputted from the first spectrum analyzing means; and first adding means for adding the expanded signal whose level is controlled by the level controlling means to the digital audio signal outputted from the filtering means, and outputting a digital audio signal of addition result.

In the above-mentioned apparatus, the expanded signal generating means preferably comprises:

non-linear processing means, having a non-linear input and output characteristic, for distorting the digital audio signal by performing non-linear processing on the digital audio signal outputted from the filtering means, and generating a digital signal having higher harmonic components of the digital audio signal; and a first high-pass filter for high-pass-filtering at least frequency components equal to or higher than the second band, from the digital signal having the higher harmonic components outputted from the non-linear processing means, and outputting a high-pass-filtered signal as an expanded signal.

In the above-mentioned apparatus, the expanded signal generating means preferably comprises:

dither signal generating means for generating a dither signal having a predetermined probability distribution for an amplitude level; and a second high-pass filter for high-pass-filtering at least frequency components equal to or higher than the second band, from the dither signal outputted from the dither signal generating means, and outputting a high-pass-filtered signal as an expanded signal.

In the above-mentioned apparatus, the expanded signal generating means preferably comprises:

non-linear processing means, having a non-linear input and output characteristic, for distorting the digital audio signal by performing non-linear processing on the digital audio signal outputted from the filtering means, and generating a digital signal having higher harmonic components of the digital audio signal;

a first high-pass filter for high-pass-filtering at least frequency components equal to or higher than the second band, from the digital signal having the higher harmonic components outputted from the non-linear processing means, and outputting a high-pass-filtered signal;

dither signal generating means for generating a dither signal having a predetermined probability distribution for an amplitude level;

a second high-pass-filter for high-pass-filtering at least frequency components equal to or higher than the second band, from the dither signal outputted from the dither signal generating means, and outputting a high-pass-filtered signal; and second adding means for adding the signal outputted from the first high-pass filter to the signal outputted from the second high-pass filter, and outputting a signal of addition result as an expanded signal.

The above-mentioned apparatus preferably further comprises a low-pass filter, having a filter characteristic that is either one of a predetermined 1/f characteristic and a predetermined $1/f^2$ characteristic, for low-pass-filtering the expanded signal, and outputting a low-pass-filtered signal to the level controlling means.

In the above-mentioned apparatus, the dither signal generating means preferably comprises:

a plurality of noise signal generating circuits for generating a plurality of pseudo noise sequence noise signals independent of each other, respectively; and third adding means for adding a plurality of pseudo noise sequence noise signals generated by the noise signal generating circuits, generating a dither signal of addition result having a probability density of either one of a Gaussian distribution and a bell-shaped distribution for an amplitude level, and outputting the dither signal as an expanded signal.

The above-mentioned apparatus preferably further comprises:

second spectrum analyzing means for calculating spectrum intensities of a plurality of predetermined bands of the digital audio signal outputted from the filtering means, and judging whether or not the digital audio signal has a single spectrum in accordance with the calculated spectrum intensities of the plurality of bands; and switching means over for switching so as to output the expanded signal to the first adding means when the second spectrum analyzing means judges that the digital audio signal does not have any single spectrum, and switching over so as not to output the expanded signal to the first adding means when the second spectrum analyzing means judges that the digital audio signal has a single spectrum.

Therefore, according to the present invention, the apparatus for expanding the band of the audio signal is constituted by a digital signal processing circuit comprising the filtering means, the first adding means, the first spectrum analyzing means, the level controlling means and the expanded signal generating means. Therefore, the present invention can provide a method and an apparatus for expanding the band of the audio signal, which cause little variation in performance of the apparatus and reduce the manufacturing cost as compared to the prior art.

Moreover, the level of addition of an expanded signal is controlled in accordance with the high-frequency spectrum intensity of an input digital audio signal from the first spectrum analyzing means. Furthermore, the expanded signal passed through the low-pass filter having either one of a 1/f characteristic and $1/f^2$ characteristic is used. Therefore, the expanded signal having a natural sound close to a musical sound signal can be added to the input signal. Accordingly, there is no unpleasantness of a sound and no deterioration in sound quality.

Furthermore, the present invention comprises the second spectrum analyzing means and the switching means, and therefore, the present invention can provide a method and an apparatus for expanding a band of an audio signal, in which the measurement of signal characteristics does not result in deterioration in a signal even if a sinusoidal signal is inputted to the apparatus.

BEST MODE FOR CARRYING OUT THE INVENTION

First Preferred Embodiment

Figure 1:
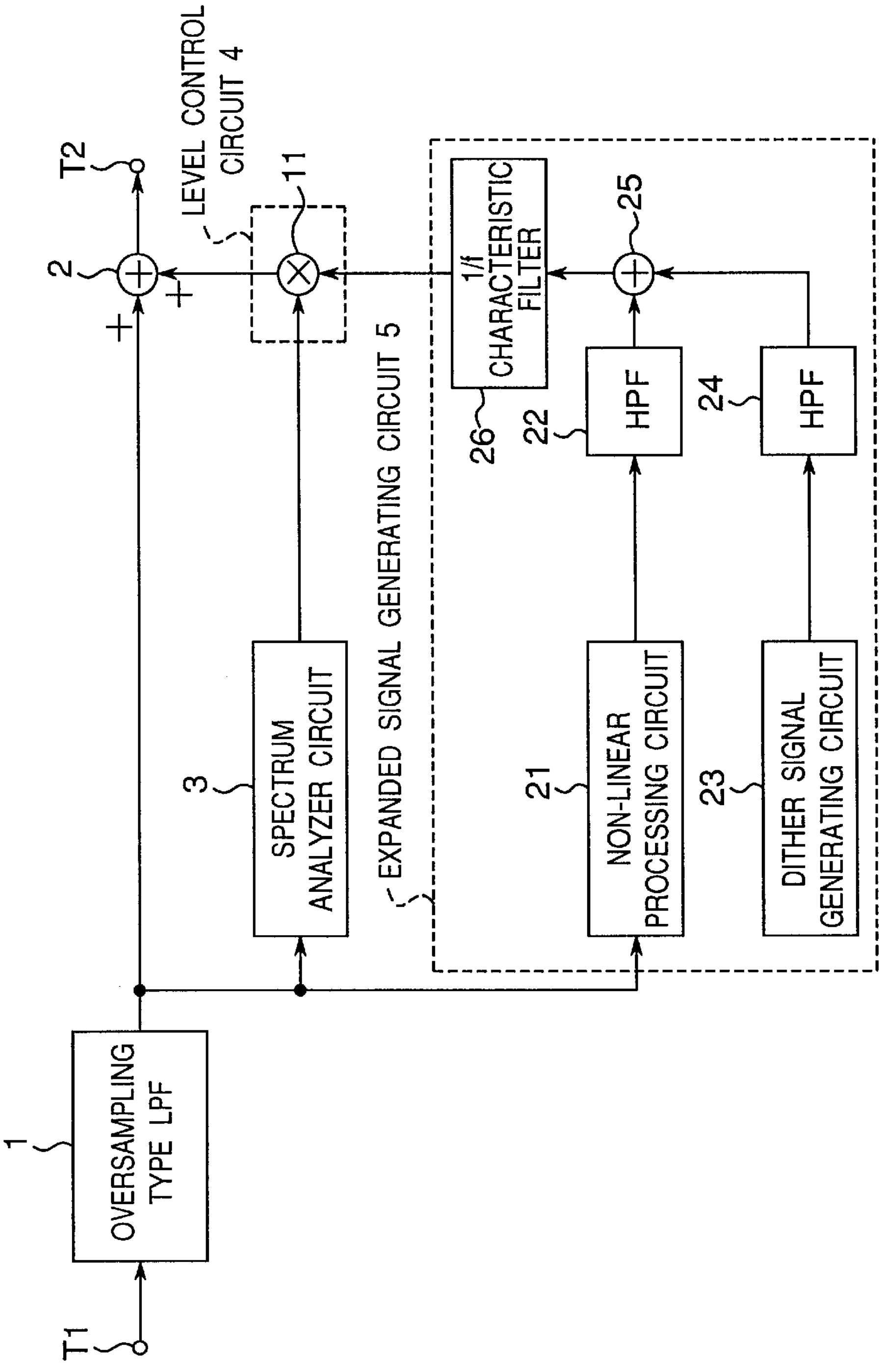
FIG. 1 is a block diagram showing a configuration of an audio signal band expanding apparatus according to a first preferred embodiment of the present invention.

FIG. 1 is a block diagram showing a configuration of an audio signal band expanding apparatus according to a first preferred embodiment of the present invention. The audio signal band expanding apparatus according to the first preferred embodiment is a digital signal processing circuit to be interposed between an input terminal T1 and an output terminal T2, and is constituted by comprising an oversampling type low-pass filter 1, an adder 2, a spectrum analyzer circuit 3, a level control circuit 4 composed of a multiplier 11, and an expanded signal generating circuit 5. The expanded signal generating circuit 5 is constituted by comprising a non-linear processing circuit 21, a high-pass filter 22, a dither signal generating circuit 23, a high-pass filter 24, an adder 25, and a 1/f characteristic filter 26.

Figure 2:
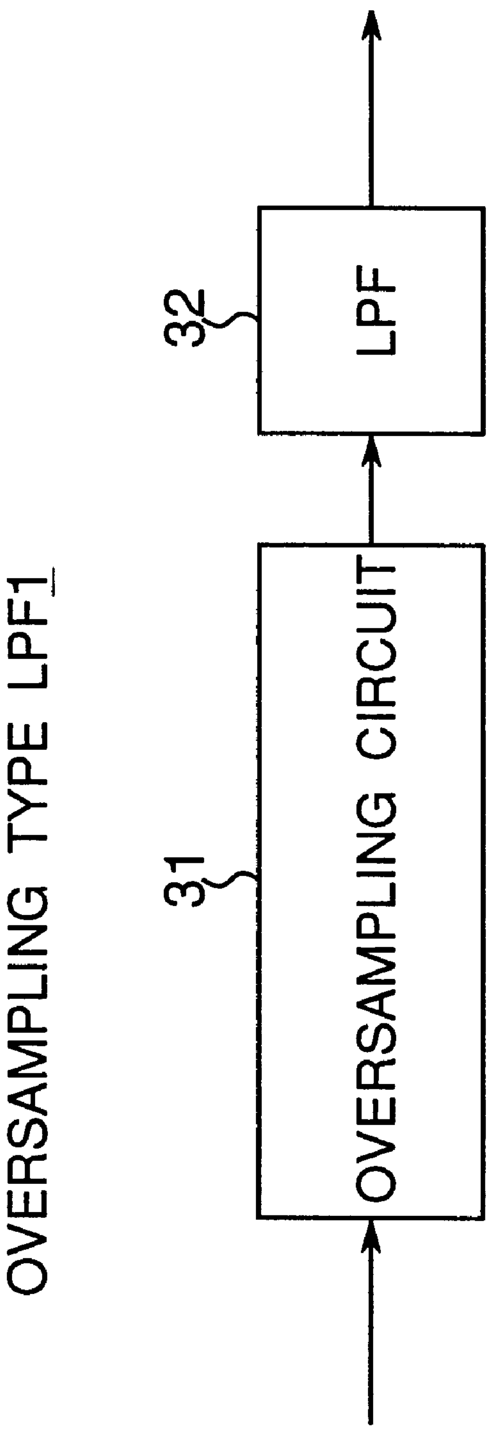
FIG. 2 is a block diagram showing an internal configuration of an oversampling type low-pass filter 1 shown in FIG. 1.

Referring to FIG. 1, a digital audio signal is inputted to the oversampling type low-pass filter 1 through the input terminal T1. The digital audio signal is a signal reproduced from a compact disc (CD), for example. In this case, the signal has a sampling frequency fs of 44.1 kHz and a word length of 16 bits. The oversampling type low-pass filter 1 is constituted by comprising an oversampling circuit 31 and a digital low-pass filter 32, as shown in FIG. 2, and is a digital filter circuit for multiplying the sampling frequency fs of the digital audio signal inputted through the input terminal T1 by p (where p denotes a positive integer equal to or greater than 2) and for attenuating, by 60 dB or more, signals of an unnecessary band ranging from a frequency of fs/2 to a frequency of p.fs/2.

Figure 3:
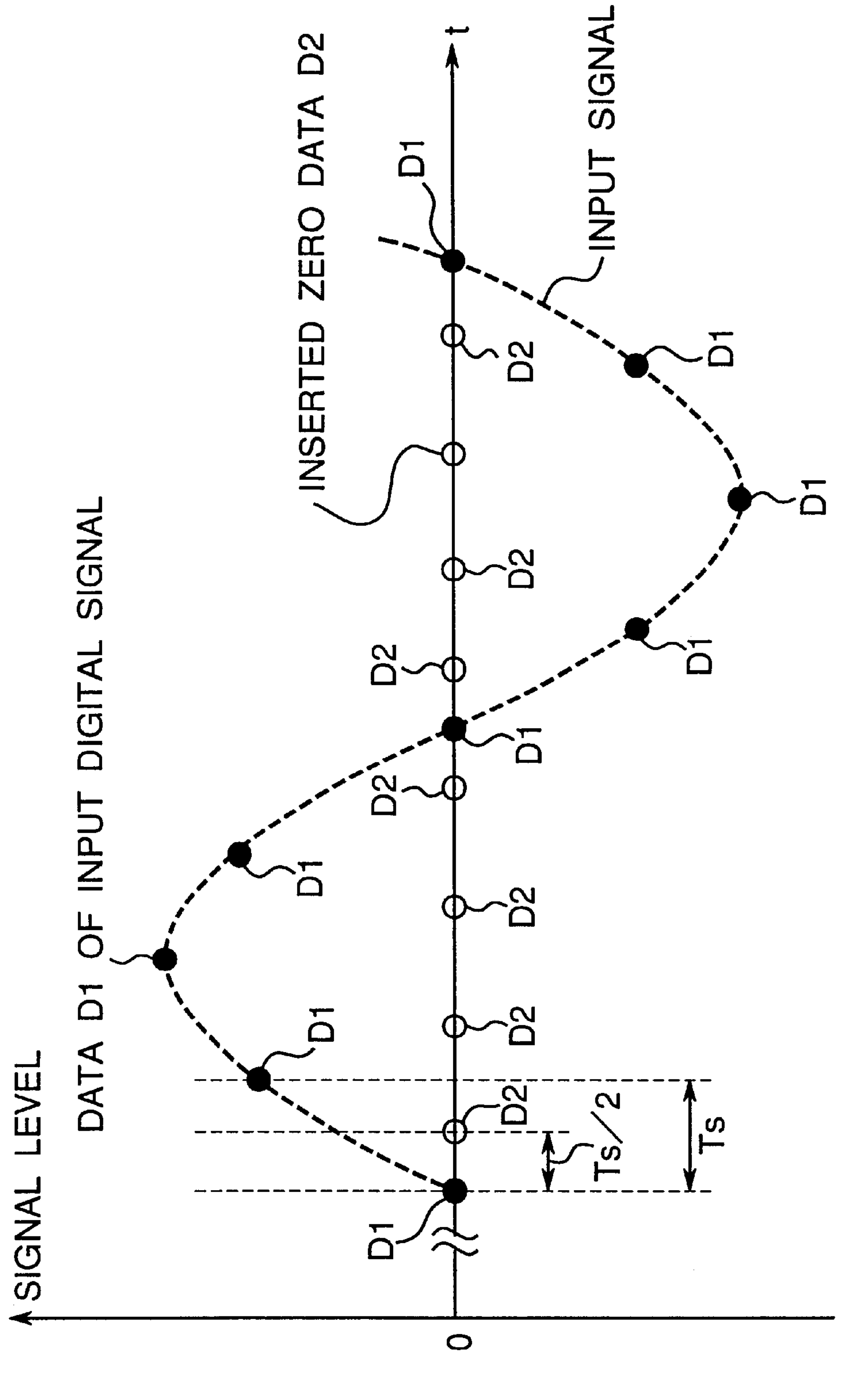
FIG. 3 is a signal waveform chart of the operation of an oversampling circuit 31 shown in FIG. 2.

For example, in the case of p=2, the digital audio signal having the sampling frequency fs (or a sampling period Ts=1/fs) is inputted to the oversampling circuit 31, and the oversampling circuit 31 inserts and interpolates zero data D2 at the intermediate point (on the time axis) located between two adjacent data D1 of the input digital audio signal at an interval of the sampling period Ts, as shown in FIG. 3. Thus, the oversampling circuit 31 performs an oversampling process, so as to convert the signal into a digital audio signal having a sampling frequency of 2 fs (or a sampling period of Ts/2), and then, outputs the digital audio signal to the digital low-pass filter 32. The digital low-pass filter 32 has the following:

(a) a pass-band of frequencies from 0 to 0.45 fs;

(b) a stop band of frequencies from 0.54 fs to fs; and (c) an attenuation of 60 dB or more at the frequency fs or higher frequencies.

The digital low-pass filter 32 low-pass-filters the input digital audio signal, to limit the band so as to eliminate aliasing noise caused by the above-mentioned oversampling, and allows passage of only an effective band (having frequencies from 0 to 0.45 fs) that is substantially possessed by the input digital audio signal, then outputting signals of the effective band to the spectrum analyzer circuit 3 and the non-linear processing circuit 21 of the expanded signal generating circuit 5.

Figure 5:
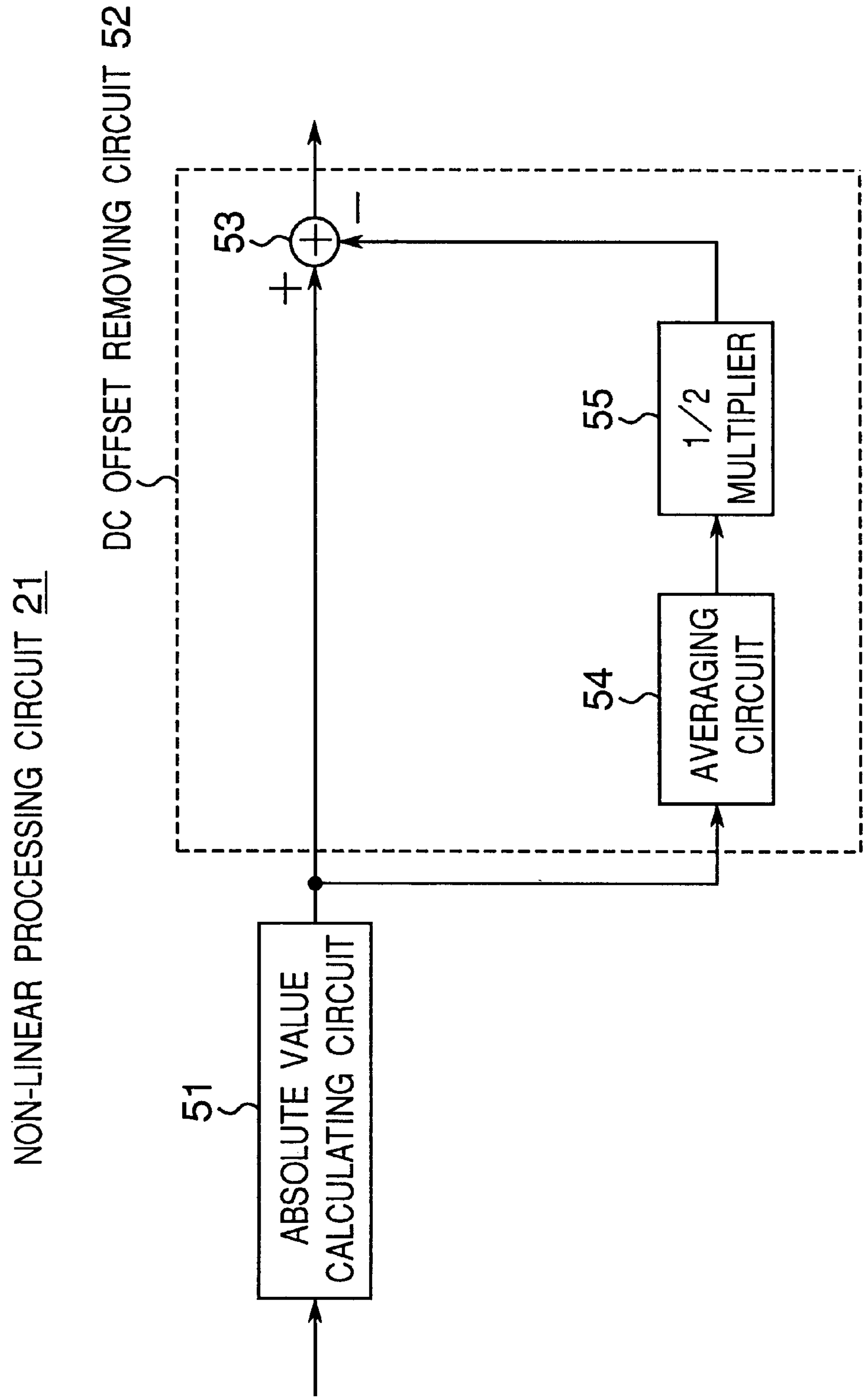
FIG. 5 is a block diagram showing an internal configuration of a non-linear processing circuit 21 shown in FIG. 1.

Subsequently, the non-linear processing circuit 21 having a non-linear input and output characteristic performs a non-linear processing on the input digital audio signal, and this leads to distorting the digital audio signal so as to generate higher harmonic components. Then, the non-linear processing circuit 21 outputs the digital audio signal having the higher harmonic components to the digital high-pass filter 22. The non-linear processing circuit 21 is constituted by comprising an absolute value calculating circuit 51 and a DC offset removing circuit 52, as shown in FIG. 5, for example. The DC offset removing circuit 52 is constituted by comprising a subtracter 53, an averaging circuit 54, and a 1/2 multiplier 55.

The absolute value calculating circuit 51 performs non-linear processing such as full-wave rectification on the input digital audio signal, and then, outputs the digital audio signal subjected to non-linear processing, to the subtracter 53 and the averaging circuit 54 of the DC offset removing circuit 52. The absolute value calculating circuit 51 outputs a signal having positive amplitude as it is, and the absolute value calculating circuit 51 converts a signal having negative amplitude into a signal having positive amplitude having the same absolute value as the absolute value of the negative amplitude, and then, outputs the signal having the positive amplitude. Therefore, the signal having the negative amplitude generates the higher harmonic components when the signal is folded to the positive side on a boundary of zero level. The averaging circuit 54 is constituted by comprising a low-pass filter having a cut-off frequency of, for example, about 0.0001 fs, which is extremely lower than the sampling frequency fs. The averaging circuit 54 calculates a temporal average value of the amplitudes of the input digital audio signal for a predetermined time interval (e.g., a time interval that is sufficiently longer than the sampling period Ts). Then, the averaging circuit 54 outputs the digital signal having the temporal average value to the 1/2 multiplier 55. Then, the 1/2 multiplier 55 multiplies the input digital signal by 1/2, and then, outputs the digital signal having a value of multiplication result to the subtracter 53 as the digital signal indicating an amount of DC offset. Furthermore, the subtracter 53 subtracts the digital signal outputted from the 1/2 multiplier 55 from the digital audio signal outputted from the absolute value calculating circuit 51 so as to remove DC offset.

The digital signal inputted through the input terminal T1 is a signal having a reference of the zero level. The digital signals outputted from the circuits shown in FIG. 1 and the digital signal outputted through the output terminal T2 also need the zero level as the reference. Although the digital signal inputted to the non-linear processing circuit 21 is a signal having a reference of the zero level, the DC offset is generated since the digital signal is converted into a positive-level signal by the absolute value calculating circuit 51 for performing non-linear processing. Therefore, the averaging circuit 54 calculates the average value of the amplitudes of the digital signal outputted from the absolute value calculating circuit 51, and the subtracter 53 subtracts one half of the absolute value from the digital signal outputted from the absolute value calculating circuit 51, so as to remove the DC offset.

Then, the digital signal containing the higher harmonic components generated by the non-linear processing circuit 21 using the level of the input digital audio signal as the reference is inputted to the digital high-pass filter 22 as shown in FIG. 1. The digital high-pass filter 22 high-pass-filters the input digital signal to allow passage of only high-frequency components of about the frequency fs/2 or higher frequencies. Then, the digital high-pass filter 22 outputs the high-frequency components to the adder 25.

The dither signal generating circuit 23 shown in FIG. 1 has a band of frequencies from 0 to p.fs/2, and generates a digital audio signal having an amplitude level at random relative to the time axis, namely, generates a dither signal in no correlation with the digital audio signal inputted through the input terminal T1. Then, the dither signal generating circuit 23 outputs the dither signal to the digital high-pass filter 24. Subsequently, the digital high-pass filter 24 high-pass-filters the input dither signal so as to allow passage of only the high-frequency components of about the frequency fs/2 or higher frequencies. Then, the digital high-pass filter 24 outputs the high-frequency components to the adder 25.

Figure 6:
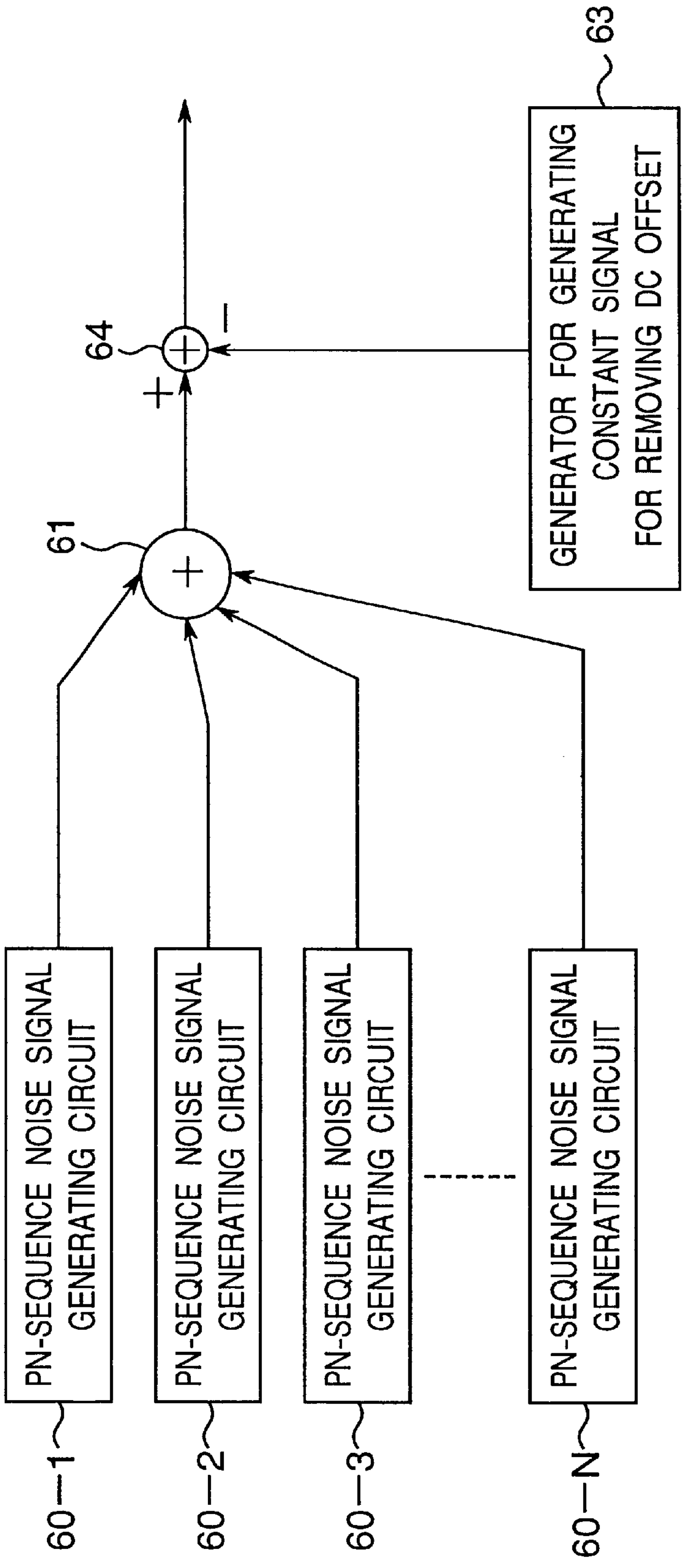
FIG. 6 is a block diagram showing an internal configuration of a dither signal generating circuit 23 shown in FIG. 1.

The dither signal generating circuit 23 is specifically configured as shown in FIG. 6, for example. Referring to FIG. 6, the dither signal generating circuit 23 is constituted by comprising a plurality of N pseudo noise sequence noise signal generating circuits (hereinafter referred to as PN-sequence noise signal generating circuits) 60-n (n=1, 2, . . . , N), an adder 61, a generator 63 for generating a constant signal for removing DC offset, and a subtracter 64. The PN-sequence noise signal generating circuits 60-n have initial values independent of each other. For example, each of the PN-sequence noise signal generating circuits 60-n generates an M-sequence noise signal, i.e., a pseudo noise signal having a uniform random amplitude level, and then, outputs the pseudo noise signal to the adder 61. Subsequently, the adder 61 adds a plurality of N pseudo noise signals outputted from a plurality of PN-sequence noise signal generating circuits 60-1 to 60-N, and then, outputs a pseudo noise signal of addition result to the subtracter 64. The generator 63 for generating a constant signal for removing DC offset signal generates the sum of the temporal average values of the pseudo noise signals from a plurality of N PN-sequence noise signal generating circuits 60-1 to 60-N, namely, a constant signal for removing DC offset, and then, outputs the constant signal for removing DC offset to the subtracter 64. Then, the subtracter 64 subtracts the constant signal for removing DC offset from the sum of the pseudo noise signals, thus generating and outputting a dither signal having no DC offset.

Figure 7:
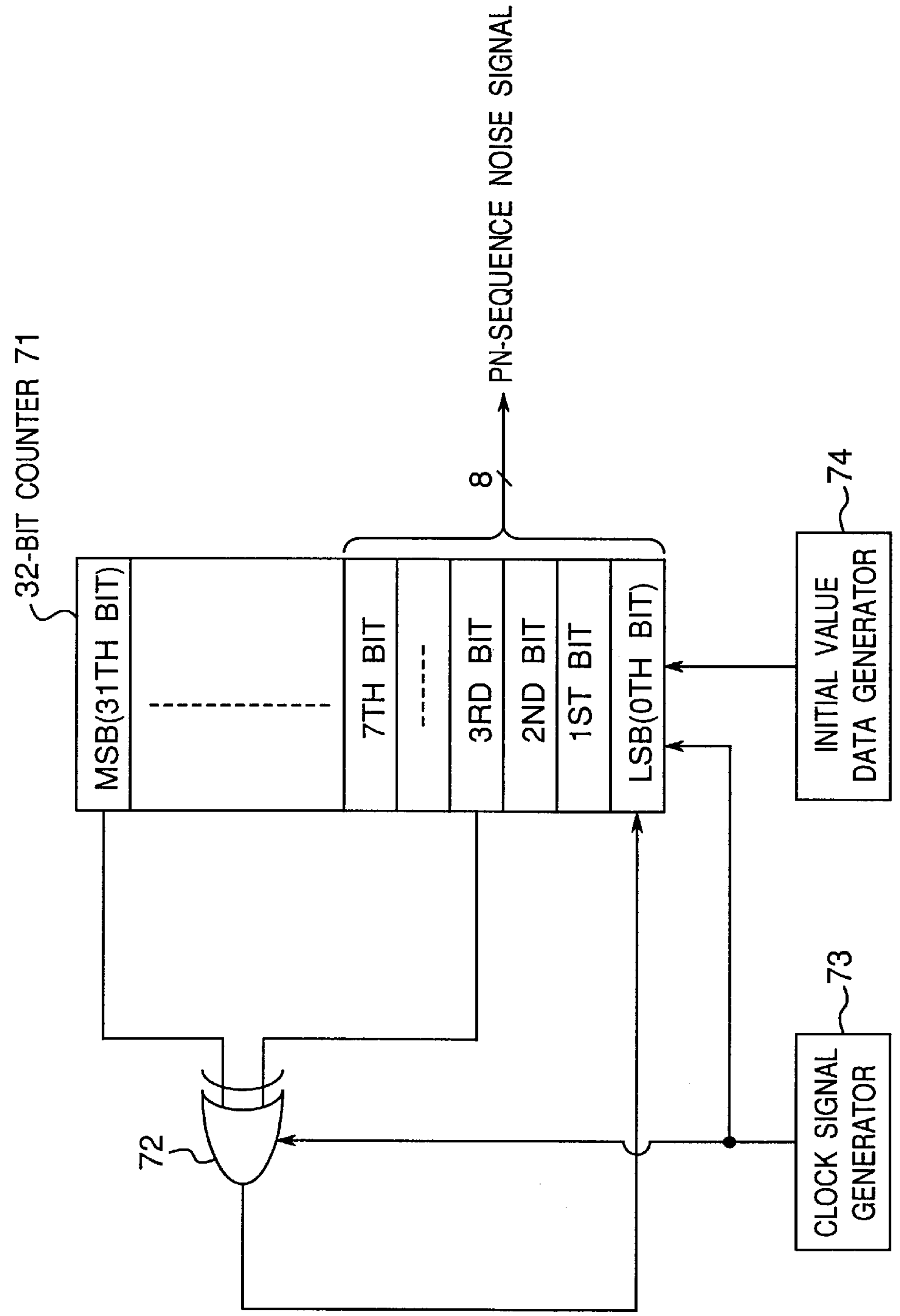
FIG. 7 is a block diagram showing an internal configuration of PN-sequence noise signal generating circuits 60-n (n=1, 2, . . . , N) shown in FIG. 6.

Each of the PN-sequence noise signal generating circuits 60-n (n=1, 2, . . . , N) is constituted by comprising a 32-bit counter 71, an exclusive OR gate 72, a clock signal generator 73, and an initial value data generator 74, as shown in FIG. 7. The 32-bit counter 71 is initialized to an initial value outputted from the initial value data generator 74, which is different from each other according to the PN-sequence noise signal generating circuits 60-n. Then, the 32-bit counter 71 counts the count value so as to increment the same by one in accordance with a clock signal generated by the clock signal generator 73. Among 32-bit data (including 0th-bit data to 31st-bit data) of the 32-bit counter 71, one-bit data of the most significant bit (MSB: the thirty-first bit) and one-bit data of the third bit are inputted to an input terminal of the exclusive OR gate 72. The exclusive OR gate 72 sets one-bit data of exclusive OR operation result, as the least significant bit (LSB) of the 32-bit counter 71, in accordance with the clock signal from the clock signal generator 73. Then, lower-order 8-bit data of the 32-bit counter 71 is outputted as a PN-sequence noise signal. The PN-sequence noise signal generating circuits 60-n are configured as described above, where the PN-sequence noise signals outputted from the PN-sequence noise signal generating circuits 60-n are 8-bit PN-sequence noise signals independent of each other, respectively.

In an example shown in FIG. 7, the PN-sequence noise signal generating circuits 60-n are configured as described above in order to generate the 8-bit PN-sequence noise signals independent of each other, respectively. However, the present invention is not limited to this, and the PN-sequence noise signal generating circuits 60-n may have any one of the following configurations.

(1) The bit positions of 8 bits of a PN-sequence noise signal to be extracted from the 32-bit counter 71 are made so as to be different from each other. That is, the PN-sequence noise signal generating circuit 60-1 extracts an 8-bit PN-sequence noise signal from the lower-order 8 bits, the PN-sequence noise signal generating circuit 60-2 extracts a PN-sequence noise signal from 8 bits immediately above the lower-order 8 bits, and the following PN-sequence noise signal generating circuits extract PN-sequence noise signals, respectively, in the similar manner.

(2) Alternatively, the bit positions of the 32-bit counter 71, from which one-bit data to be inputted to the exclusive OR gate 72 is extracted, are made so as to be different from each other according to the PN-sequence noise signal generating circuits 60-n.

(3) Alternatively, the above-mentioned modification (1) and the above-mentioned modification (2) are combined.

Figure 8:
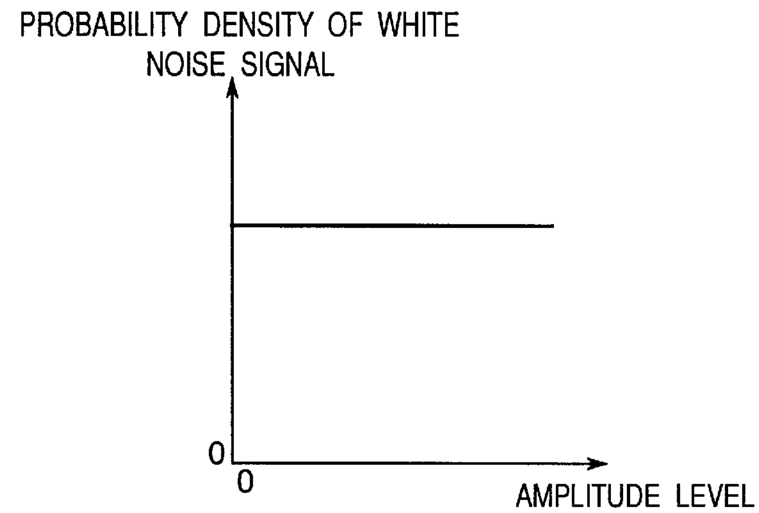
FIG. 8 is a graph showing a function of a probability density for an amplitude level of a white noise signal generated by an example of the PN-sequence noise signal generating circuits 60-n (n=1, 2, . . . , N) shown in FIG. 7.
Figure 9:
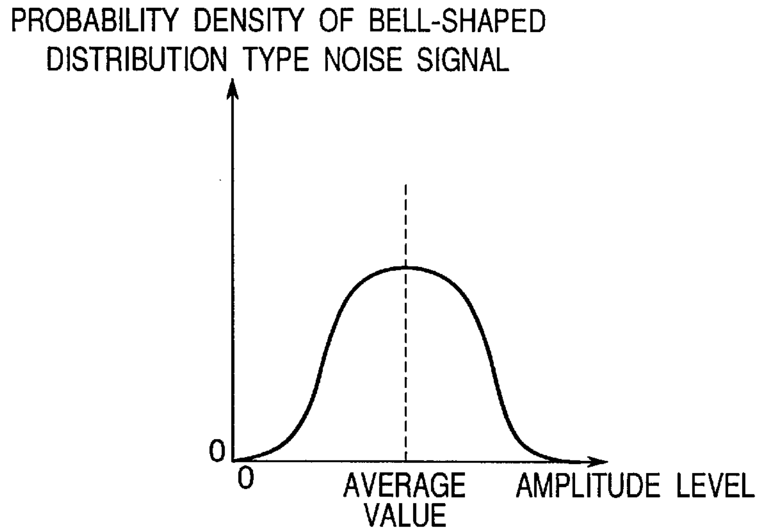
FIG. 9 is a graph showing a function of a probability density for an amplitude level of a bell-shaped distribution type noise signal generated by another example of the PN-sequence noise signal generating circuits 60-n (n=1, 2, . . . , N) shown in FIG. 7.
Figure 10:
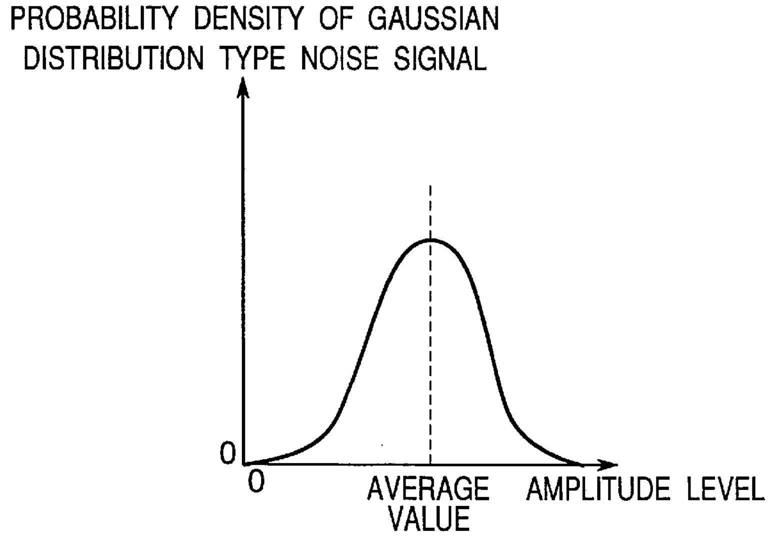
FIG. 10 is a graph showing a function of a probability density for an amplitude level of a Gaussian distribution type noise signal generated by still another example of the PN-sequence noise signal generating circuits 60-n (n=1, 2, . . . , N) shown in FIG. 7.

By adding a plurality of PN-sequence noises independent of each other, the PN-sequence noise signals each having a probability density for the amplitude level can be generated as shown in FIGS. 8, 9 and 10. For example, in the case of n=1, a white noise signal having a probability density of a uniform distribution for the amplitude level can be generally generated as shown in FIG. 8. In the case of n=12, a Gaussian distribution type noise signal having the probability density of the Gaussian distribution for the amplitude level can be generally generated as shown in FIG. 10 by adding the PN-sequence noise signals respectively outputted from the PN-sequence noise signal generating circuits 60-n which generate 12 uniform random numbers since the Gaussian distribution has a variance of 1/12 when the central limit theorem is used. In the case of n=3, a bell-shaped distribution type (hanging bell-shaped) noise signal having the probability density of a bell-shaped distribution for the amplitude level can be generated as shown in FIG. 9, and the bell-shaped distribution is close or similar to the Gaussian distribution and has a variance slightly wider than the variance of the Gaussian distribution. As described above, the circuits shown in FIGS. 6 and 7 are configured, and, for example, the noise signal shown in FIG. 9 or 10 is generated, and this leads to that the dither signal close to a natural sound or a musical sound signal can be generated by using a small-scale circuit.

Figure 11:
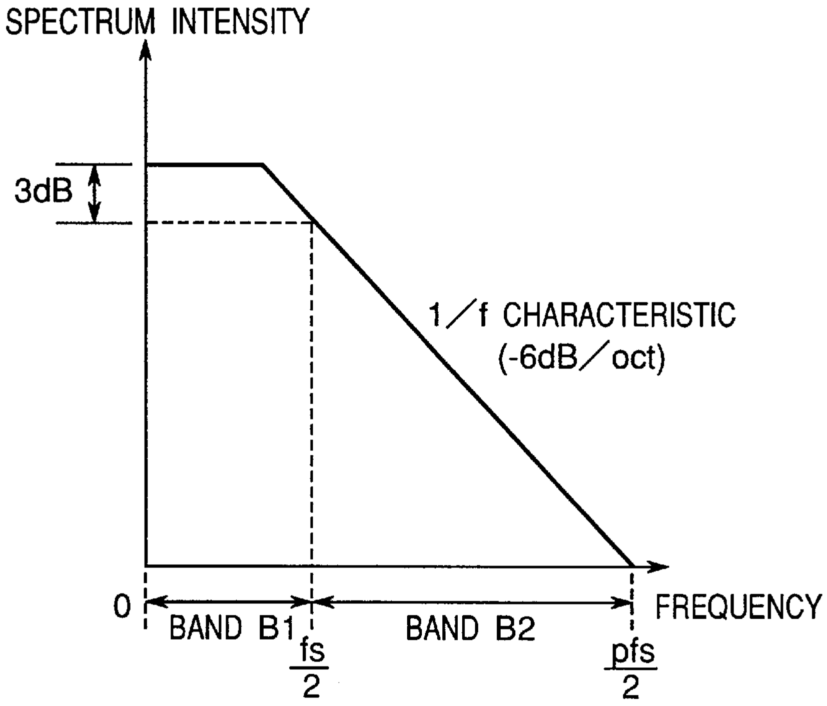
FIG. 11 is a spectrum graph showing frequency characteristics of a 1/f characteristic filter 26 shown in FIG. 1.

Referring again to FIG. 1, the adder 25 of the expanded signal generating circuit 5 adds the band-limited digital signal having the higher harmonic components from the high-pass filter 22 to the band-limited dither signal from the high-pass filter 24, and then, outputs a digital signal of addition result to the multiplier 11 of the level control circuit 4 through the 1/f characteristic filter 26. As shown in FIG. 11, the 1/f characteristic filter 26 is of a so-called 1/f characteristic low-pass filter having an attenuation characteristic having a gradient of −6 dB/oct in a band B2 of frequencies from fs/2 to p.fs/2, which is higher than a band B1 of frequencies from 0 to fs/2, where p represents an oversampling rate and denotes any integer between 2 and generally 8, for example.

Figure 12:
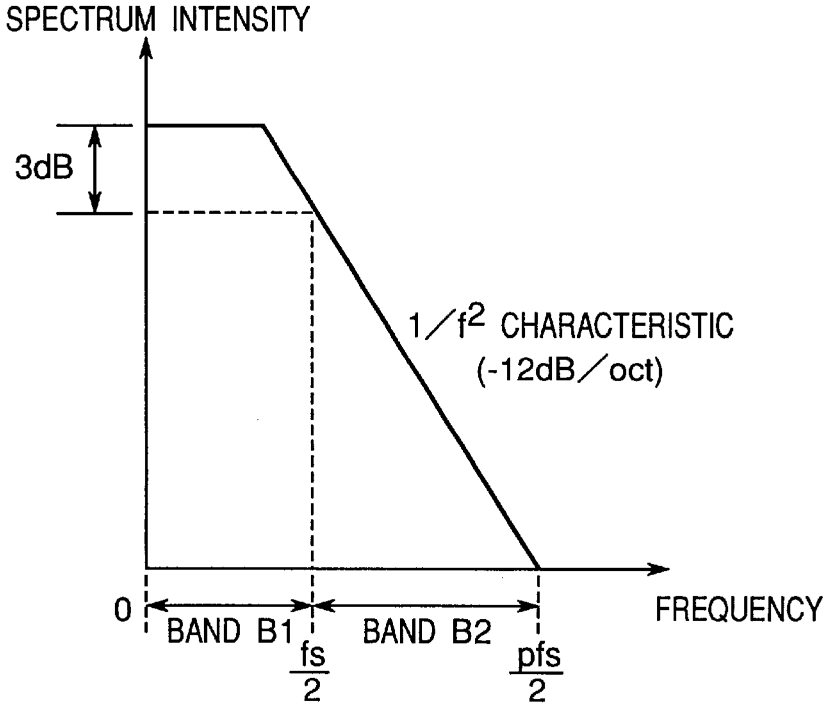
FIG. 12 is a spectrum graph showing frequency characteristics of a $1/f^2$ characteristic filter replacing the 1/f characteristic filter 26 shown in FIG. 1.

The position into which the 1/f characteristic filter 26 is to be interposed is not limited to the preferred embodiment shown in FIG. 1. The 1/f characteristic filter 26 may be interposed between the high-pass filter 22 and the adder 25 and between the high-pass filter 24 and the adder 25. Alternatively, the 1/f characteristic filter 26 may be interposed only between the high-pass filter 22 and the adder 25 or only between the high-pass filter 24 and the adder 25. The 1/f characteristic filter 26 may be replaced by a $1/f^2$ characteristic filter having an attenuation characteristic shown in FIG. 12. As shown in FIG. 12, the $1/f^2$ characteristic filter 26 is of a so-called $1/f^2$ characteristic low-pass filter having an attenuation characteristic having a gradient of −12 dB/oct in a band B2 of frequencies from fs/2 to p.fs/2, which is higher than a band B1 of frequencies from 0 to fs/2.

Figure 4:
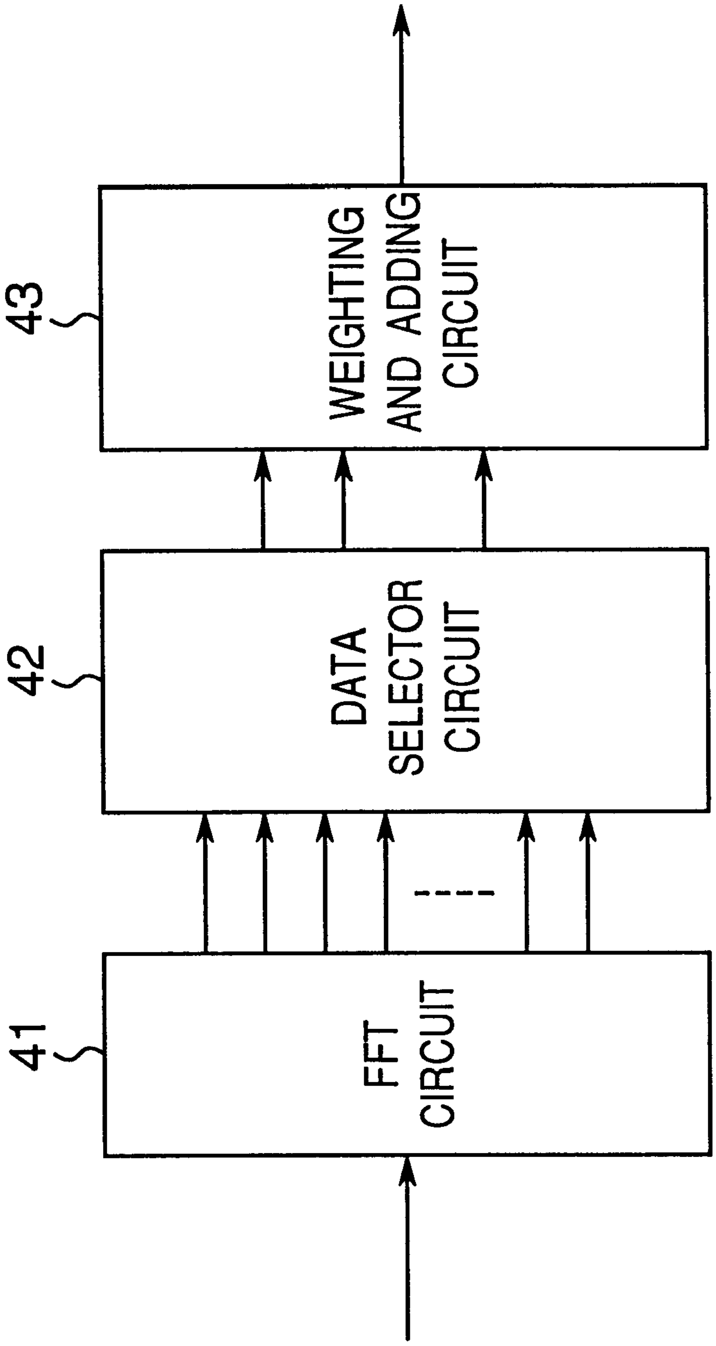
FIG. 4 is a block diagram showing an internal configuration of a spectrum analyzer circuit 3 shown in FIG. 1.

The spectrum analyzer circuit 3 calculates the spectrum intensity of a predetermined band of the digital audio signal outputted from the oversampling type low-pass filter 1, and then, outputs a signal indicating the calculated spectrum intensity to the multiplier 11 of the level control circuit 4. The spectrum analyzer circuit 3 comprises an FFT circuit 41, a data selector circuit 42 and a weighting and adding circuit 43, as shown in FIG. 4, for example. The FFT circuit 41 performs a fast Fourier transform processing on the input digital audio signal by using an FFT operation method, so as to calculate 1024 spectrum intensities in total at an interval of a frequency of fs/1024 in accordance with data at an interval of 2048 Ts if the frequency resolving power is equal to 1024, for example, and then, outputs the calculated 1024 spectrum intensities to the data selector circuit 42. Subsequently, the data selector circuit 42 selectively extracts data of spectrum intensities corresponding to a band of frequencies of, for example, from fs/4 to fs/2 in accordance with the input spectrum intensities at an interval of the frequency fs/1024, and then, outputs the extracted data to the weighting and adding circuit 43. Furthermore, the weighting and adding circuit 43 adds the extracted data of spectrum intensities with predetermined weighting coefficients for respective data so as to calculate the spectrum intensity of the band of frequencies from fs/4 to fs/2 of the input digital audio signal, and then, outputs a signal indicating spectrum intensity of calculation result to the multiplier 11 of the level control circuit 4.

Then, the level control circuit 4 controls the signal level of an expanded signal which is the sum signal that is obtained by adding the band-limited signal having the higher harmonic components from the 1/f characteristic filter 26 to the dither signal, in accordance with the signal indicating the spectrum intensity from the spectrum analyzer circuit 3. The level control circuit 4 constituted by the multiplier 11 as shown in FIG. 1, multiplies the expanded signal from the expanded signal generating circuit 5 by the signal indicating the spectrum intensity, and then, outputs a signal of multiplication result to the adder 2. That is, the level control circuit 4 operates so as to increase the signal level from the 1/f characteristic filter 26 when the spectrum intensity of the frequencies from FS/4 to FS/2 of the input digital audio signal is high, whereas the level control circuit 4 operates so as to reduce the signal level from the 1/f characteristic filter 26 when the spectrum intensity of the frequencies from FS/4 to FS/2 of the input digital audio signal is low.

Furthermore, the adder 2 adds the digital audio signal from the oversampling type low-pass filter 1 to the sum signal that is obtained by adding the digital signal having the higher harmonic components from the level control circuit 4 to the dither signal, and then, outputs a signal of addition result through the output terminal T2.

As described above, according to the first preferred embodiment of the present invention, the higher harmonic components having a spectral structure similar to that of a musical sound signal in the band equal to or higher than the band of the input digital audio signal (i.e., having a generating mechanism substantially similar to the generating mechanism for a natural sound, by allowing the frequency of occurrence of the dither signal to have a substantial Gaussian distribution or the bell-shaped distribution), and the dither signal are generated, and the digital signal having the higher harmonic components generated in response to the high-frequency spectrum intensity of the input digital audio signal and the dither signal are added to the input digital audio signal, and this leads to that the present invention can easily generate a digital audio signal having an expanded audio band as compared to the prior art.

Since all the signal processing by the audio signal band expanding apparatus according to the preferred embodiment is digital signal processing, there is caused no variation in performance due to variations in components of the circuit and temperature properties. Moreover, no deterioration in sound quality occurs each time an audio signal passes through the circuit. Furthermore, even if the precision of the filter is improved, the circuit of the present invention causes no increase in the circuit scale and thus no increase in manufacturing cost, as compared to an analog circuit configuration.

In the preferred embodiment, the signal having the higher harmonic components is generated by the non-linear processing circuit 21 without limiting the band of the input digital audio signal. However, the signal having the higher harmonic components may be generated after inputting to the non-linear processing circuit 21 the signal whose band is previously limited by a high-pass filter similar to the high-pass filter 22.

The absolute value calculating circuit 51 shown in FIG. 5, which is of a full-wave rectifier circuit, is used to constitute the non-linear processing circuit 21. However, the present invention is not limited to this, and the absolute value calculating circuit 51 may be replaced with a half-wave rectifier circuit, which outputs only a positive part of the input digital audio signal, and which outputs a zero-level signal in the case of a negative part of the input digital audio signal.

Second Preferred Embodiment

Figure 13:
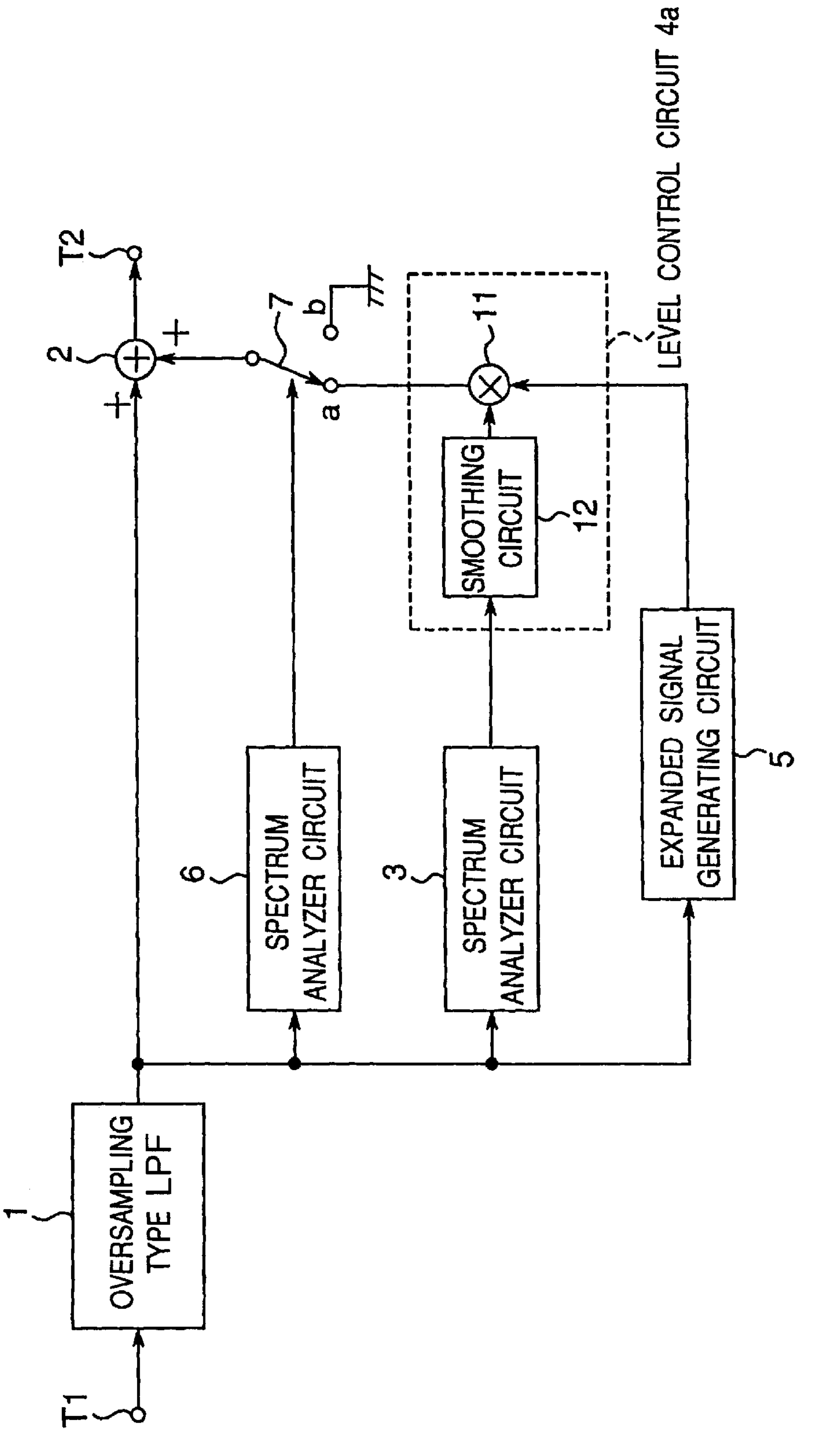
FIG. 13 is a block diagram showing a configuration of an audio signal band expanding apparatus according to a second preferred embodiment of the present invention.

FIG. 13 is a block diagram showing a configuration of an audio signal band expanding apparatus according to a second preferred embodiment of the present invention. In FIG. 13, the components similar to those shown in FIG. 1 are indicated by the same reference numerals, and the detailed description thereof is omitted. The audio signal band expanding apparatus according to the second preferred embodiment is different from the audio signal band expanding apparatus shown in FIG. 1 in the following:

(1) The level control circuit 4 is replaced with a level control circuit 4*a* comprising a smoothing circuit 12 and a multiplier 11.

(2) The apparatus further comprises a spectrum analyzer circuit 6 and a switch 7.

The above-mentioned differences will be described in detail below.

Referring to FIG. 13, envelope detection, integration processing in the time domain or low-pass filtering is subjected to a signal, which is outputted from the spectrum analyzer circuit 3 and which exhibits the spectrum intensity of a predetermined band of frequencies from fs/4 to fs/2. After that, an expanded signal outputted from the expanded signal generating circuit 5 is multiplied by the processed signal. Thus, the level control circuit 4*a* is adapted to gradually or slowly perform level control.

Figure 14:
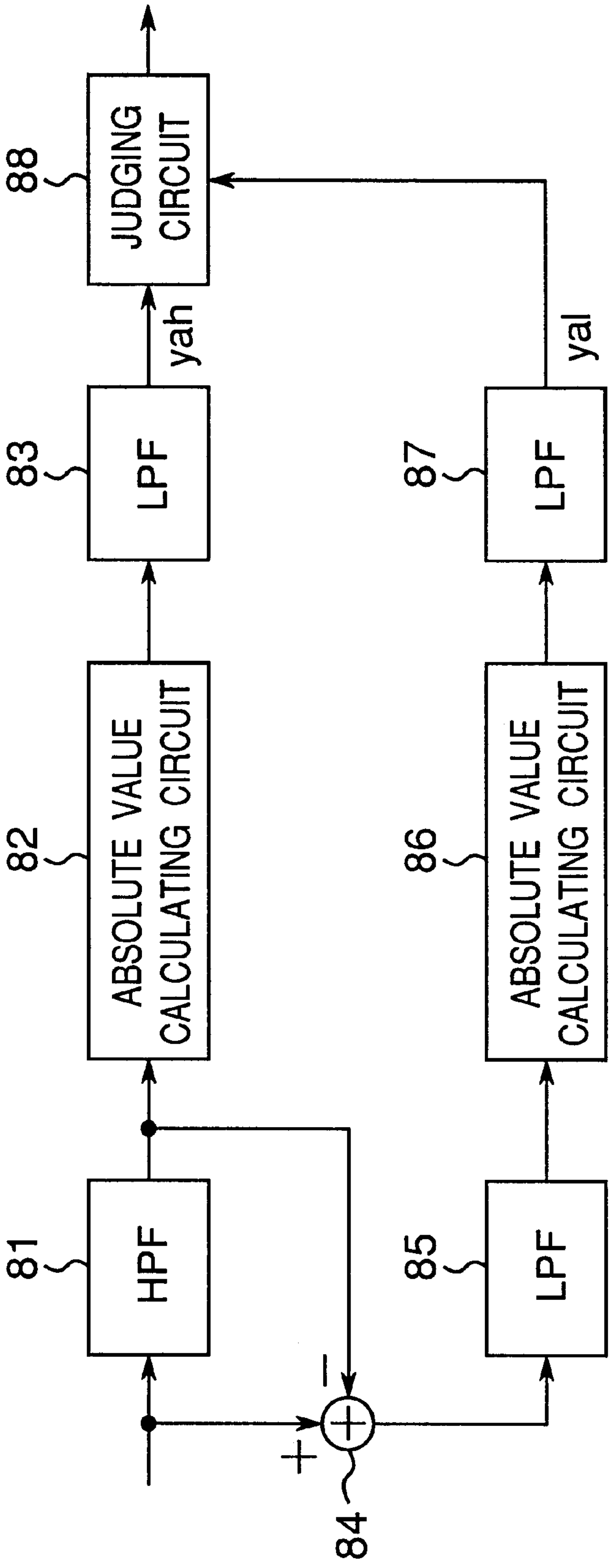
FIG. 14 is a block diagram showing an internal configuration of a spectrum analyzer circuit 6 shown in FIG. 13.

FIG. 14 is a block diagram showing an internal configuration of the spectrum analyzer circuit 6 shown in FIG. 13. As shown in FIG. 14, the spectrum analyzer circuit 6 is constituted by comprising a high-pass filter 81, an absolute value calculating circuit 82, a low-pass filter 83, a subtracter 84, a low-pass filter 85, an absolute value calculating circuit 86, a low-pass filter 87, and a judging circuit 88.

Referring to FIG. 14, a low-pass-filtered digital audio signal from the oversampling type low-pass filter 1 shown in FIG. 13 is inputted to the high-pass filter 81 and the subtracter 84. The high-pass filter 81 high-pass-filters the low-pass-filtered digital audio signal so as to allow passage of only components of the band of frequencies from fs/4 to fs/2. After that, the high-pass-filtered signal is passed through the absolute value calculating circuit 82 and the low-pass filter 83 for performing integration processing in the time domain, and this leads to calculation of spectrum intensity yah of the band of frequencies from fs/4 to fs/2 of the input digital audio signal. Then, a signal indicating the spectrum intensity yah is outputted to the judging circuit 88.

On the other hand, the subtracter 84 subtracts the high-pass-filtered signal from the high-pass filter 81 from the input digital audio signal from the oversampling type low-pass filter 1. After that, a signal of subtraction result is passed through the low-pass filter 85, and this leads to that components of a band of frequencies from 0 to fs/4 are extracted. The extracted components of the band of frequencies from 0 to fs/4 are passed through the absolute value calculating circuit 86 and the low-pass filter 87 for performing temporal integration processing, and this leads to that spectrum intensity yal of the band of frequencies from 0 to fs/4 of the input digital audio signal is calculated. Then, a signal indicating the spectrum intensity yal is outputted to the judging circuit 88.

Then, the judging circuit 88 compares the spectrum intensity yal of the frequencies from 0 to FS/4 of the input digital audio signal with the spectrum intensity yah of the frequencies from fs/4 to fs/2 thereof, then controls switching of the switch 7 in the following manner.

(a) When the spectrum intensity yal is equal to or greater than a predetermined threshold level and the spectrum intensity yah is less than the above-mentioned threshold level, or (b) when the spectrum intensity yal is less than the predetermined threshold level and the spectrum intensity yah is equal to or greater than the predetermined threshold level, the judging circuit 88 switches over the switch 7 to a contact "b", and then, outputs a zero-level signal to the adder 2 without outputting any expanded signal from the level control circuit **4*a* to the adder 2. In any case other than the above-mentioned cases (a) and (b), the judging circuit 88 switches the switch 7 to a contact "a", and then, outputs the expanded signal from the level control circuit 4*a* to the adder 2**.

Figure 15:
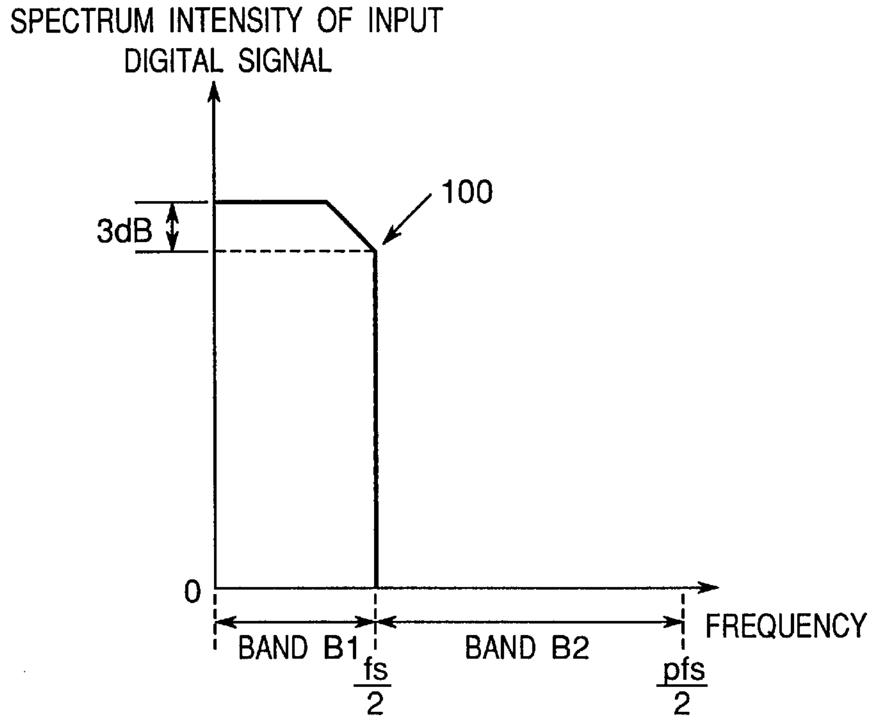
FIG. 15 is a spectrum graph showing a spectrum intensity of an input digital signal inputted to the audio signal band expanding apparatus shown in FIG. 13.

That is, when the input digital audio signal has the spectrum intensity equal to or greater than a predetermined threshold value in two bands where the two band includes one band of frequencies from 0 to fs/4 and another band of frequencies from fs/4 to fs/2, the switch 7 is switched over to the contact "a", and this leads to that the band of the input digital audio signal is expanded. When the spectrum intensity yal is equal to or greater than the predetermined threshold level and the spectrum intensity yah is less than the predetermined threshold level, the input signal does not substantially have the components of the band of frequencies from fs/4 to fs/2. Thus, it is not necessary to expand the band, and therefore, the switch 7 is switched over to the contact "b". When the spectrum intensity yal is less than the predetermined threshold level and the spectrum intensity yah is equal to or greater than the predetermined threshold level, the judging circuit 88 judges that the input signal has no fundamental-wave component and only the higher harmonic components, namely, that the input signal is not a musical sound but a single spectrum of high-frequency or a non-musical sound intentionally generated. Thus, the switch 7 is switched over to the contact "b". Thus, when the single spectrum or the non-musical sound signal is detected, the switch 7 is controlled so as not to expand the band as shown in FIG. 15. In other words, the spectrum of the digital signal outputted from the audio signal band expanding apparatus according to the preferred embodiment is cut off to a spectrum 100 of the highest band in the band B1 of the input digital signal.

Figure 16:
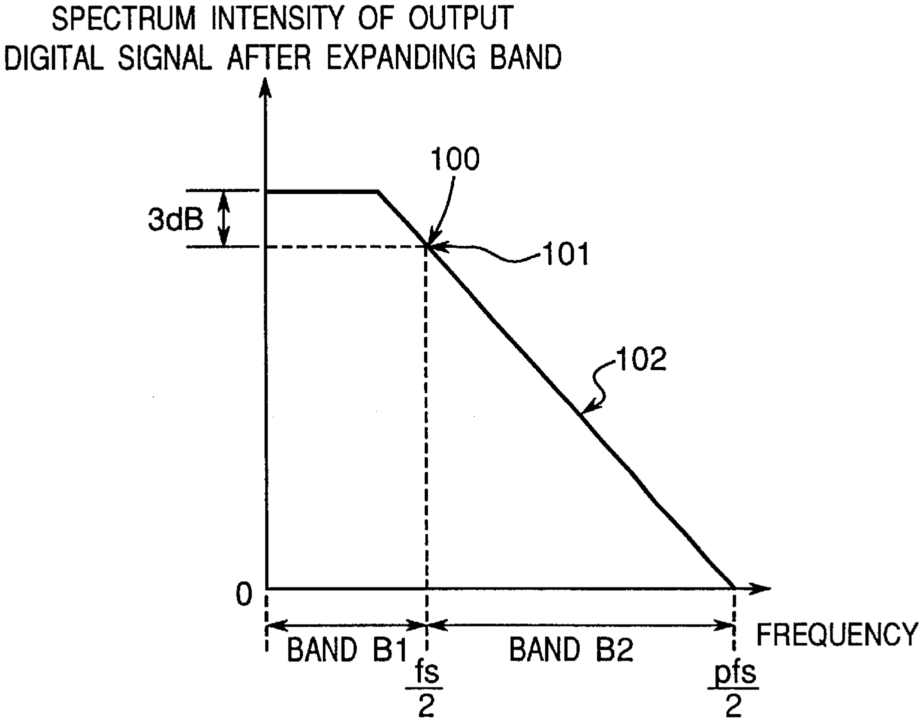
FIG. 16 is a spectrum graph showing a spectrum intensity of the digital signal whose band is expanded by the audio signal band expanding apparatus shown in FIG. 13.
Figure 17:
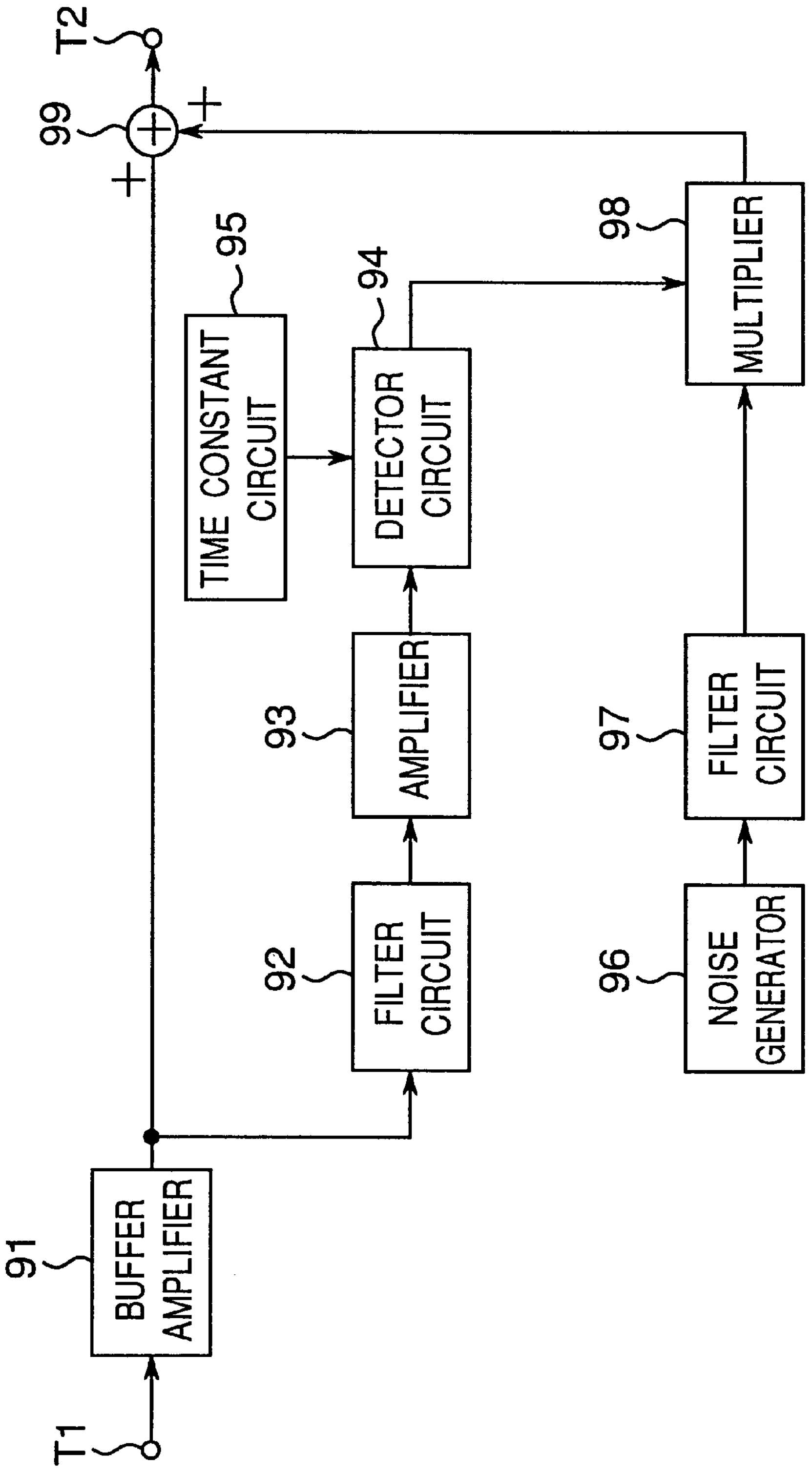
Fig.17 PRIOR ART
FIG. 17 is a block diagram showing a configuration of an audio signal band expanding apparatus according to the prior art.

In the preferred embodiment, since the audio signal band expanding apparatus comprises the smoothing circuit 12, then when the switch 7 is switched over to the contact "a", the expanded signal from the expanded signal generating circuit 5 is added to the input digital audio signal so that these signals may be combined smoothly in spectrum characteristics as shown in FIG. 16. That is, the spectrum of the digital signal outputted from the audio signal band expanding apparatus according to the preferred embodiment is connected with a spectrum 101 of the lowest band in the band B2 at the spectrum 100 of the highest band in the band B1 of the input digital signal. After that, the gradient of the spectrum in the band B2 is equalized with the gradient of the spectrum in the band B1, so that these gradients are made continuous.

As described above, the second preferred embodiment of the present invention has the function and advantageous effects similar to those of the first preferred embodiment. Moreover, the audio signal band expanding apparatus according to the second preferred embodiment comprises the smoothing circuit 12, and therefore, the expanded signal generated by the expanded signal generating circuit 5 can be added to the input digital audio signal so that the expanded signal may be combined with the input digital audio signal smoothly in spectrum characteristics in accordance with the high-frequency spectrum intensity of the input digital audio signal.

Moreover, the audio signal band expanding apparatus according to the second preferred embodiment comprises the spectrum analyzer circuit 6 and the switch 7, and therefore, when a sinusoidal wave having a single spectrum or a non-musical sound signal is inputted to the apparatus, the switch 7 can be controlled so that the switch 7 is switched over to the contact "b" so as not to add the expanded signal to the input signal. In other words, the apparatus can stop the function for expanding the audio band, and therefore, the apparatus can prevent the measurement of signal characteristics from resulting in marked deterioration in the signal characteristics.

Modified Preferred Embodiments

In the above-described preferred embodiments, the expanded signal generating circuit 5 generates an expanded signal in the following manner: the non-linear processing circuit 21 and the high-pass filter 22 generate a signal having higher harmonic components, the dither signal generating circuit 23 and the high-pass filter 24 generate a dither signal, and the adder 25 adds the signal having the higher harmonic components to the dither signal, and this leads to generating an expanded signal. However, the present invention is not limited to this, and the expanded signal may contain at least either one of the above-mentioned signal having the higher harmonic components and the above-mentioned dither signal.

In the above-described preferred embodiments, the spectrum analyzer circuit 6 calculates the spectrum intensities of two bands, and this leads to judging whether or not an input digital audio signal is a single spectrum or a non-musical sound signal. However, the present invention is not limited to this, and the spectrum analyzer circuit 6 may calculate the spectrum intensities of a plurality of bands, and this leads to judging whether or not an input digital audio signal is a single spectrum or a non-musical sound signal.

In the above-described preferred embodiments, the audio signal band expanding apparatus comprises the 1/f characteristic filter 26. However, the present invention is not limited to this, and the audio signal band expanding apparatus may exclude the 1/f characteristic filter 26.

In the above-described preferred embodiments, the audio signal band expanding apparatus comprises a digital signal processing circuit of hardware. However, the present invention is not limited to this, and for example, the configuration shown in FIG. 1 or FIG. 13 may be implemented by a signal processing program, which may be executed by a DSP (Digital Signal Processor).

Possibility of Industrial Utilization

As described in detail above, according to the preferred embodiments of the present invention, the audio signal band expanding apparatus comprising the oversampling type low-pass filter 1, the adder 2, the spectrum analyzer circuit 3, the level control circuit 4 and the expanded signal generating circuit 5 is constituted by a digital signal processing circuit. Therefore, the present invention can provide a method and an apparatus for expanding a band of an audio signal, which cause little variation in performance of the apparatus and reduce manufacturing cost as compared to the prior art.

Moreover, the level of addition of an expanded signal is controlled in accordance with the high-frequency spectrum intensity of an input digital audio signal from the spectrum analyzer circuit 3, and furthermore an expanded signal passed through the 1/f characteristic filter 26 is used. Therefore, an expanded signal having a natural sound close to a musical sound signal can be added to the input signal. Accordingly, there is no unpleasantness of a sound and no deterioration in sound quality.

Furthermore, the audio signal band expanding apparatus comprises the spectrum analyzer circuit 6 and the switch 7.

Therefore, the present invention can provide a method and an apparatus for expanding a band of an audio signal, in which the measurement of signal characteristics does not result in deterioration in a signal even if a sinusoidal signal is inputted to the apparatus.

What is claimed is:

1. A method for expanding a band of an audio signal comprising:

oversampling a digital audio signal of a first band having a predetermined maximum frequency with a sampling frequency that is two or more times the maximum frequency to produce an oversampled digital audio signal, and low-pass-filtering the oversampled digital audio signal so as to eliminate aliasing noise caused by the oversampling, and outputting the low-pass-filtered oversampled digital audio signal;

calculating a spectrum intensity of a predetermined band of the low-pass-filtered oversampled digital audio signal, and outputting a signal indicating the calculated spectrum intensity;

generating an expanded signal having frequency components of a second band higher than the first band;

controlling a level of the expanded signal in response to the signal indicating the calculated spectrum intensity; and adding the expanded signal having the controlled level to the low-pass-filtered oversampled digital audio signal to produce an addition resultant digital audio signal, wherein said generating the expanded signal comprises:

distorting the digital audio signal by performing non-linear processing on the low-pass-filtered oversampled digital audio signal with a non-linear input and output characteristic, and generating a digital signal having higher harmonic components of the digital audio signal; and high-pass-filtering at least frequency components equal to or higher than the second band, from the digital signal having the higher harmonic components to produce a high-pass-filtered signal, and outputting the high-pass-filtered signal as the expanded signal.

2. The method as claimed in claim 1, further comprising:

low-pass-filtering the expanded signal with a filter characteristic that is one of a predetermined 1/f characteristic and a predetermined $1/f^2$ characteristic, prior to said controlling the level.

3. The method as claimed in claim 1, further comprising:

calculating spectrum intensities of a plurality of predetermined bands of the low-pass-filtered oversampled digital audio signal, and judging whether or not the digital audio signal has a single spectrum in accordance with the calculated spectrum intensities of the plurality of bands; and switching over so as to output the expanded signal when judging that the digital audio signal does not have any single spectrum, and switching over so as not to output the expanded signal when judging that the digital audio signal has a single spectrum.

4. A method for expanding a band of an audio signal comprising:

oversampling a digital audio signal of a first band having a predetermined maximum frequency with a sampling frequency that is two or more times the maximum frequency to produce an oversampled digital audio signal, and low-pass-filtering the oversampled digital audio signal so as to eliminate aliasing noise caused by the oversampling, and outputting the low-pass-filtered oversampled digital audio signal;

calculating a spectrum intensity of a predetermined band of the low-pass-filtered oversampled digital audio signal, and outputting a signal indicating the calculated spectrum intensity;

generating an expanded signal having frequency components of a second band higher than the first band;

controlling a level of the expanded signal in response to the signal indicating the calculated spectrum intensity; and adding the expanded signal having the controlled level to the low-pass-filtered oversampled digital audio signal to produce a first addition resultant digital audio signal, wherein said generating the expanded signal comprises:

distorting the digital audio signal by performing non-linear processing on the low-pass-filtered oversampled digital audio signal with a non-linear input and output characteristic, and generating a digital signal having higher harmonic components of the digital audio signal;

high-pass-filtering at least frequency components equal to or higher than the second band, from the digital signal having the higher harmonic components to produce a first high-pass-filtered signal, and outputting the first high-pass-filtered signal;

generating a dither signal having a predetermined probability distribution for an amplitude level;

high-pass-filtering at least frequency components equal to or higher than the second band from the dither signal to produce a second high-pass-filtered signal, and outputting the second high-pass-filtered signal; and adding the two high-pass-filtered signals to produce a second addition resultant signal, and outputting the second addition resultant signal as the expanded signal.

5. The method as claimed in claim 4, further comprising:

low-pass-filtering the expanded signal with a filter characteristic that is one of a predetermined 1/f characteristic and a predetermined $1/f^2$ characteristic, prior to said controlling the level.

6. The method as claimed in claim 4, further comprising:

calculating spectrum intensities of a plurality of predetermined bands of the low-pass-filtered oversampled digital audio signal, and judging whether or not the digital audio signal has a single spectrum in accordance with the calculated spectrum intensities of the plurality of bands; and switching over so as to output the expanded signal when judging that the digital audio signal does not have any single spectrum, and switching over so as not to output the expanded signal when judging that the digital audio signal has a single spectrum.

7. A method for expanding a band of an audio signal comprising:

oversampling a digital audio signal of a first band having a predetermined maximum frequency with a sampling frequency that is two or more times the maximum frequency to produce an oversampled digital audio signal, and low-pass-filtering the oversampled digital audio signal so as to eliminate aliasing noise caused by the oversampling, and outputting the low-pass-filtered oversampled digital audio signal;

calculating a spectrum intensity of a predetermined band of the low-pass-filtered oversampled digital audio signal, and outputting a signal indicating the calculated spectrum intensity;

generating an expanded signal having frequency components of a second band higher than the first band;

controlling a level of the expanded signal in response to the signal indicating the calculated spectrum intensity; and adding the expanded signal having the controlled level to the low-pass-filtered oversampled digital audio signal to produce an addition resultant digital audio signal, wherein said generating the expanded signal comprises:

generating a dither signal having a predetermined probability distribution for an amplitude level; and high-pass-filtering at least frequency components equal to or higher than the second band, from the dither signal to produce a high-pass-filtered signal, and outputting the high-pass-filtered signal as the expanded signal, wherein said generating the dither signal comprises:

generating a plurality of pseudo noise sequence noise signals independent of each other, respectively; and adding the plurality of pseudo noise sequence noise signals, generating an addition resultant dither signal having a probability density of one of a Gaussian distribution and a bell-shaped distribution for an amplitude level, and outputting the dither signal as the expanded signal.

8. The method as claimed in claim 7, further comprising:

low-pass-filtering the expanded signal with a filter characteristic that is one of a predetermined 1/f characteristic and a predetermined $1/f^2$ characteristic, prior to said controlling the level.

9. The method as claimed in claim 7, further comprising:

calculating spectrum intensities of a plurality of predetermined bands of the low-pass-filtered oversampled digital audio signal, and judging whether or not the digital audio signal has a single spectrum in accordance with the calculated spectrum intensities of the plurality of bands; and switching over so as to output the expanded signal when judging that the digital audio signal does not have any single spectrum, and switching over so as not to output the expanded signal when judging that the digital audio signal has a single spectrum.

10. An apparatus for expanding a band of an audio signal comprising:

a filter operable to oversample a digital audio signal of a first band having a predetermined maximum frequency with a sampling frequency that is two or more times the maximum frequency to produce an oversampled digital audio signal, and low-pass-filter the oversampled digital audio signal so as to eliminate aliasing noise caused by the oversampling, and output the low-pass-filtered oversampled digital audio signal;

a first spectrum analyzer circuit operable to calculate a spectrum intensity of a predetermined band of the low-pass-filtered oversampled digital audio signal outputted from said filter, and output a signal indicating the calculated spectrum intensity;

an expanded signal generating circuit operable to generate an expanded signal having frequency components of a second band higher than the first band;

a level control circuit operable to control a level of the expanded signal in response to the signal indicating the calculated spectrum intensity outputted from said first spectrum analyzer circuit; and a first adder operable to add the expanded signal whose level is controlled by said level control circuit to the low-pass-filtered oversampled digital audio signal outputted from said filter to produce an addition resultant digital audio signal, wherein said expanded signal generating circuit comprises:

a non-linear processing circuit, having a non-linear input and output characteristic, operable to distort the digital audio signal by performing non-linear processing on the low-pass-filtered oversampled digital audio signal outputted from said filter, and generate a digital signal having higher harmonic components of the digital audio signal; and a first high-pass filter operable to high-pass-filter at least frequency components equal to or higher than the second band, from the digital signal having the higher harmonic components outputted from said non-linear processing circuit to produce a high-pass-filtered signal, and output the high-pass-filtered signal as the expanded signal.

11. The apparatus as claimed in claim 10, further comprising:

a low-pass filter, having a filter characteristic that is one of a predetermined 1/f characteristic and a predetermined $1/f^2$ characteristic, operable to low-pass-filter the expanded signal, and output a low-pass-filtered signal to said level control circuit.

12. The apparatus as claimed in claim 10, further comprising:

a second spectrum analyzer circuit operable to calculate spectrum intensities of a plurality of predetermined bands of the digital audio signal outputted from said filter, and judge whether or not the digital audio signal has a single spectrum in accordance with the calculated spectrum intensities of the plurality of bands; and a switch operable to switch over so as to output the expanded signal to said first adder when said second spectrum analyzer circuit judges that the digital audio signal does not have any single spectrum, and switch over so as not to output the expanded signal to said first adder when said second spectrum analyzer circuit judges that the digital audio signal has a single spectrum.

13. An apparatus for expanding a band of an audio signal comprising:

a filter operable to oversample a digital audio signal of a first band having a predetermined maximum frequency with a sampling frequency that is two or more times the maximum frequency to produce an oversampled digital audio signal, and low-pass-filter the oversampled digital audio signal so as to eliminate aliasing noise caused by the oversampling, and output the low-pass-filtered oversampled digital audio signal;

a first spectrum analyzer circuit operable to calculate a spectrum intensity of a predetermined band of the low-pass-filtered oversampled digital audio signal outputted from said filter, and output a signal indicating the calculated spectrum intensity;

an expanded signal generating circuit operable to generate an expanded signal having frequency components of a second band higher than the first band;

a level control circuit operable to control a level of the expanded signal in response to the signal indicating the calculated spectrum intensity outputted from said first spectrum analyzer circuit; and a first adder operable to add the expanded signal whose level is controlled by said level control circuit to the low-pass-filtered oversampled digital audio signal outputted from said filter to produce a first addition resultant digital audio signal, wherein said expanded signal generating circuit comprises:

a non-linear processing circuit, having a non-linear input and output characteristic, operable to distort the digital audio signal by performing non-linear processing on the low-pass-filtered oversampled digital audio signal outputted from said filter, and generate a digital signal having higher harmonic components of the digital audio signal;

a first high-pass filter operable to high-pass-filter at least frequency components equal to or higher than the second band, from the digital signal having the higher harmonic components outputted from said non-linear processing circuit to produce a first high-pass-filtered signal, and output the first high-pass-filtered signal;

a dither signal generating circuit operable to generate a dither signal having a predetermined probability distribution for an amplitude level;

a second high-pass filter operable to high-pass-filter at least frequency components equal to or higher than the second band, from the dither signal outputted from said dither signal generating circuit to produce a second high-pass-filtered signal, and output the second high-pass-filtered signal; and a second adder operable to add the signal outputted from the first high-pass filter to the signal outputted from the second high-pass filter to produce a second addition resultant signal, and output the second addition resultant signal as the expanded signal.

14. The apparatus as claimed in claim 13, further comprising:

a low-pass filter, having a filter characteristic that is one of a predetermined 1/f characteristic and a predetermined $1/f^2$ characteristic, operable to low-pass-filter the expanded signal, and output a low-pass-filtered signal to said level control circuit.

15. The apparatus as claimed in claim 13, further comprising:

a second spectrum analyzer circuit operable to calculate spectrum intensities of a plurality of predetermined bands of the digital audio signal outputted from said filter, and judge whether or not the digital audio signal has a single spectrum in accordance with the calculated spectrum intensities of the plurality of bands; and a switch operable to switch over so as to output the expanded signal to said first adder when said second spectrum analyzer circuit judges that the digital audio signal does not have any single spectrum, and switch over so as not to output the expanded signal to said first adder when said second spectrum analyzer circuit judges that the digital audio signal has a single spectrum.

16. An apparatus for expanding a band of an audio signal comprising:

a filter operable to oversample a digital audio signal of a first band having a predetermined maximum frequency with a sampling frequency that is two or more times the maximum frequency to produce an oversampled digital audio signal, and low-pass-filter the oversampled digital audio signal so as to eliminate aliasing noise caused by the oversampling, and output the low-pass-filtered oversampled digital audio signal;

a first spectrum analyzer circuit operable to calculate a spectrum intensity of a predetermined band of the low-pass-filtered oversampled digital audio signal outputted from said filter, and output a signal indicating the calculated spectrum intensity;

an expanded signal generating circuit operable to generate an expanded signal having frequency components of a second band higher than the first band;

a level control circuit operable to control a level of the expanded signal in response to the signal indicating the calculated spectrum intensity outputted from said first spectrum analyzer circuit; and a first adder operable to add the expanded signal whose level is controlled by said level control circuit to the low-pass-filtered oversampled digital audio signal outputted from said filter to produce an addition resultant digital audio signal, wherein said expanded signal generating circuit comprises:

a dither signal generating circuit operable to generate a dither signal having a predetermined probability distribution for an amplitude level; and a high-pass filter operable to high-pass-filter at least frequency components equal to or higher than the second band, from the dither signal outputted from said dither signal generating circuit to produce a high-pass-filtered signal, and output the high-pass-filtered signal as the expanded signal, wherein said dither signal generating circuit comprises:

a plurality of noise signal generating circuits operable to generate a plurality of pseudo noise sequence noise signals independent of each other, respectively; and a second adder operable to the plurality of pseudo noise sequence noise signals generated by the noise signal generating circuits, generate an addition resultant dither signal having a probability density of one of a Gaussian distribution and a bell-shaped distribution for an amplitude level, and output the dither signal as the expanded signal.

17. The apparatus as claimed in claim 16, further comprising:

a low-pass filter, having a filter characteristic that is one of a predetermined 1/f characteristic and a predetermined $1/f^2$ characteristic, operable to low-pass-filter the expanded signal, and output a low-pass-filtered signal to said level control circuit.

18. The apparatus as claimed in claim 16, further comprising:

a second spectrum analyzer circuit operable to calculate spectrum intensities of a plurality of predetermined bands of the digital audio signal outputted from said filter, and judge whether or not the digital audio signal has a single spectrum in accordance with the calculated spectrum intensities of the plurality of bands; and a switch operable to switch over so as to output the expanded signal to said first adder when said second spectrum analyzer circuit judges that the digital audio signal does not have any single spectrum, and switch over so as not to output the expanded signal to said first adder when said second spectrum analyzer circuit judges that the digital audio signal has a single spectrum.

* * * * *